US009539455B2

(12) United States Patent
Hoelen et al.

(10) Patent No.: US 9,539,455 B2
(45) Date of Patent: Jan. 10, 2017

(54) METHOD FOR SOIL TREATMENT

(71) Applicants: Thomas Hoelen, San Francisco, CA (US); Cesar Ovalles, Walnut Creek, CA (US); Deyuan Kong, San Ramon, CA (US)

(72) Inventors: Thomas Hoelen, San Francisco, CA (US); Cesar Ovalles, Walnut Creek, CA (US); Deyuan Kong, San Ramon, CA (US)

(73) Assignee: CHEVRON U.S.A. INC, San Ramon, CA (US)

( * ) Notice: Subject to any disclaimer, the term of this patent is extended or adjusted under 35 U.S.C. 154(b) by 0 days.

(21) Appl. No.: 14/737,075

(22) Filed: Jun. 11, 2015

(65) Prior Publication Data

US 2015/0360065 A1 Dec. 17, 2015

Related U.S. Application Data

(60) Provisional application No. 62/010,716, filed on Jun. 11, 2014.

(51) Int. Cl.
| | |
|---|---|
| *A62D 3/17* | (2007.01) |
| *A62D 3/15* | (2007.01) |
| *C05G 3/00* | (2006.01) |
| *H01J 37/317* | (2006.01) |
| *H01J 37/20* | (2006.01) |

(Continued)

(52) U.S. Cl.
CPC . *A62D 3/15* (2013.01); *B09C 1/00* (2013.01); *C05G 3/00* (2013.01); *H01J 37/20* (2013.01); *H01J 37/317* (2013.01); *A62D 2101/20* (2013.01); *H01J 2237/063* (2013.01); *H01J 2237/30* (2013.01)

(58) Field of Classification Search
CPC ............ A62D 3/17; G21F 9/165; B01J 19/121
USPC .......................................................... 588/306
See application file for complete search history.

(56) References Cited

U.S. PATENT DOCUMENTS

| 5,457,269 A | 10/1995 | Schonberg |
| 5,744,811 A | 4/1998 | Schonberg et al. |

(Continued)

FOREIGN PATENT DOCUMENTS

| KR | 20020091479 A1 | 12/2002 |
| KR | 20040010902 A | 2/2004 |
| WO | 9506619 | 3/1995 |

OTHER PUBLICATIONS

"Remediation of Petroleum Contaminated Soils: Biological, Physical, and Chemical Processes", Eve Riser-Roberts, CRC, 1998, p. 6.

(Continued)

*Primary Examiner* — Edward Johnson
(74) *Attorney, Agent, or Firm* — Frank C. Turner; Karen R. DiDomenicis

(57) ABSTRACT

The present invention is directed to a method for irradiating of solids containing petroleum or petroleum derived compounds (PPDCs), such as soils, oily sludge, drill cuttings, sediments, and non-commercial petroleum industry products, with electron beams in order to physically and/or chemically alter the composition of the PPDCs. The method includes the step of separating PPDC gas and liquids in the presence of a gas driver. Optionally, the method includes the steps of treating off-gases and applying one or more amendments to PPCD-impacted solid material pre-irradiation, post-irradiation, or during electron beam irradiation.

10 Claims, 2 Drawing Sheets

(51) Int. Cl.
*B09C 1/00* (2006.01)
*A62D 101/20* (2007.01)

(56) References Cited

U.S. PATENT DOCUMENTS

| 6,121,507 A | 9/2000 | Kim et al. |
| 8,192,591 B2 | 6/2012 | Zaikin et al. |
| 2004/0057883 A1 | 3/2004 | Avnery |
| 2010/0307912 A1 | 12/2010 | Zommer |

OTHER PUBLICATIONS

"Aspects of Hydrocarbons Radiolysis", T. Gaumann and J. Hoigne Ed., Academinc Press, 1968, p. 1.
"Radiation Chemistry of Hydrocarbons", G. Foldiak ed. Elsevier, 1981, p. 17.
"Radiolysis of Hydrocarbons", A. V. Topchiev Ed., English Ed. by R. A. Holroyd, Elsevier, 1964, p. 11.
"Prospects and Challenges for the Industrial Use of Electron Beam Accelerators", Berejka, A. J., Int. Topical Meeting on Nuclear Research App. Utilization of Accelerators, May 4-8, 2009, Vienna.
"Electron-Induced Chain Reactions of Heavy Petroleum Fluids-Dominant Process Variables", Masoud Alfi, Paulo F. Da Silva, Maria A. Barrufet, and Rosana G. Moreira, SPE No. 157882, SPE Heavy Oil Conference Canada, Jun. 12-14, 2012, Calgary, Alberta, Canada.
"Utilization of Charged Particles as an Efficient Way to Improve Rheological Properties of Heavy Asphaltic Petroleum Fluids", Masoud Alfi, SPE, Paulo F. Da Silva, Maria A. Barrufet, SPE, and Rosana G. Moreira, SPE No. 153528, SPE Latin America and Caribbean Petroleum Engineering Conference, Apr. 16-18, 2012, Mexico City, Mexico.
"Advancements of Radiation Induced-Degradation of Pollutants in Drinking and Waste Water", Getoff, N., Appl. Radiat. Isot. 40, 585 (1989).
Remediation of Groundwater Poluted with Chlorinated Ethylenes by Ozone-electron Beam Irradiation Treatment, Gehringer et al., Appl. Radiat. Isot., 43, 1107 (1992).
"Treatment of Volatile Organic Compounds Contained in Soil by Pulsed Intense Relativistic Electron Beam Irradiation", Imada G., IEEJ Trans. Electr. Electron. Eng., 6, 88 (2011).
Radiolytic degradation of dioxin on soil: Optimal conditions and economic considerations, Hilarides, R.J., Environ. Prog., 13, 263 (1994).
High Energy Radiation destruction of Polycyclic Aromatic Hydrocarbons (PAH) in Soil Wash Containing Surfactants:, Galav V., et al., in Contaminated Soils,vol. 2, Kostecki P. T., Calabrese, E. J. and Bonazountas, M. Ed, Amberst, 1997, Chapeter 25, p. 295.
International Search Report, issued on Jan. 5, 2016 during the prosecution of International Application No. PCT/US2015/035256.
Written Opinion of the International Searching Authority, issued on Jan. 5, 2016 during the prosecution of International Application No. PCT/US2015/035256.

METHOD FOR SOIL TREATMENT

FIELD OF THE INVENTION

The present invention relates generally to a system and method for treatment of solids or solid materials containing petroleum and/or petroleum derived components (PPDCs), e.g., crude oils, gasoline, jet fuel, waxes, paraffins, asphalts, weathered crude oil compounds, drill cuttings, etc., with electron beams (e-beams).

BACKGROUND OF THE INVENTION

Conventional methods for treating PPDC-impacted solids, such as landfilling, bioremediation, combustion, and thermal desorption, are typically time consuming and/or expensive, and may not always be preferred or adequate for reducing Total Petroleum Hydrocarbons (TPH).

E-beam processing has advantages over conventional methods for treatment of PPDC. In general, e-beam processing can cause chemical and physical changes in various substances by exposure to ionizing radiation in the form of electrons with energies lower than about 10 MeV. This process can have various effects depending on the material being processed, the dosage, or amount of treatment that is being applied. These effects include but are not limited to bond cracking, cross-linking, polymer degradation, sterilization, pasteurization, and vulcanization. E-beam differs from other irradiation processes, most notably because it is highly controllable and can be used without significant residual effects.

Several examples have been reported in the literature for e-beam irradiation of liquid PPDC streams, but none where solids containing PPDC have been e-beam irradiated. For example, PetroBeam reported the treatment of a 12° API heavy crude oil (1.7% wt of S and 6% water) pulsed irradiated at 2 MeV at 50° C. with time-average of 20 and 37 kGy/s and with a total absorbed dose of 360 kGy (residence time ~13 s). The results showed respectively 17% and 22% conversion of residue having an atmospheric equivalent boiling point >450° C., and a 10-fold reduction on the sulfur content.

Similarly, researchers from Texas A&M University have treated an atmospheric residue (7.4° API, 10.4% asphaltenes and hydrogen to carbon molar ratio H/C=1.47) and reported lower viscosity and higher amounts of distillable material after e-beam radiation thermal cracking at 385° C. for one hour (RTC at 10 kGy) compared to conventional (no e-beam) thermal cracking (TC) at 385° C. for one hour. Percentages of 550° C. residue conversion were 31% for RTC versus 26% for TC. Stability was measured by determining the viscosity over a period of three months, and the results showed that viscosity of the RTC samples was stable whereas the TC increased reaching a plateau after two months.

However, there are no known e-beam methods for: remediating PPDC impacted soil or sediments; treating undesired oily streams (e.g., oily sludge, drill cuttings, tank bottoms, etc.); or high throughput (volume per unit time) and high efficiency (rate and yield of TPH removal or transformation) processes for the application of e-beam irradiation. In addition, there are no known methods that include the recycling or disposal of the converted, mobilized or otherwise transformed PPDC, including gaseous components.

As such, a need exists for improved high throughput and high efficiency e-beam irradiation processing methods for remediating PPDC-impacted solids for beneficial reuse and for recycling or disposing gaseous hydrocarbons resulting from the e-beam irradiation.

SUMMARY OF THE INVENTION

A method and corresponding system are provided for ex situ transformation of petroleum or petroleum derived compounds (PPDC) in PPDC-impacted solid material. PPDCs to be transformed include crude oils, gasoline, jet fuel, waxes, paraffins, asphalts, weathered crude oil compounds, drill cuttings, etc. In one aspect of the invention, the method includes the steps of irradiating the PPDC-impacted solid material with at least one electron beam source, and utilizing a gas driver, e.g., a carrier gas flow from the bottom to the top of the reactor that assists with the removal gases produced during e-beam processing, to separate PPDCs from the PPDC-impacted solid material. The gas driver may be generated by gas pumps included in the flue-gas treatment system, and may include one or more of air, nitrogen, argon, carbon dioxide, methane, and natural gas. The gas driver can also be generated on-site in a generator or stored in containers or other gas flow device.

In accordance with one embodiment, the disclosed method includes the step of irradiating the PPDC-impacted solid material with multiple electron beam sources. The irradiation with the multiple electron beam sources may be performed sequentially, or simultaneously (in parallel). The multiple electron beam sources can have similar or different characteristics, e.g., energy levels, rates, total dosage, etc.

In accordance other embodiments, the method includes treating off-gases with a flue gas treatment system 9 (which may include gas absorbents and/or an afterburner), mixing or agitating the PPDC-impacted solid material, heating the PPDC-impacted solid material to temperatures up to 250° C., and/or applying one or more amendments to the PPDC-impacted solid material.

In accordance with other embodiments, the method includes collecting and/or separating liquids, solids or gases.

In accordance with another aspect of the present invention, a system is provided for ex situ transformation of petroleum or petroleum derived compounds (PPDC) in PPDC-impacted solid material. The system includes a chamber for receiving the PPDC-impacted solid material, a soil transport system for passing the PPDC-impacted solid material through the chamber, at least one electron beam source disposed within or connected to the chamber for applying one or more electron beams for irradiating the PPDC-impacted solid material, and a gas flow device for directing, delivering, driving or pulling a gas driver through the chamber for separating liquids and gases from the PPDC-impacted solid material.

Advantageously, the present invention may be used to treat impacted solids, such as PPDC impacted soil, sediments, non-commercial products, or waste, with e-beams to reduce the presence of the PPDCs, e.g., to minimize the TPH content of soil. Exemplary solids may include soil, oily sludge, sediments, drill cuttings and other non-commercial products from the oil industry. The present invention may be used to improve separation of petroleum compounds, increase the effectiveness of other treatment processes (such as bioremediation or thermal treatment), remove a fraction of PPDC by cracking into volatile compounds, and/or reduce the amount of solvent extractable petroleum compounds by polymerization. In accordance with the present invention, the following solid matrix effects improve the effectiveness of conventional e-beam irradiation treatment:

presence and concentration of biotic material, inorganics, and moisture; petroleum composition; and energy transfer from the solid to the target PPDC.

BRIEF DESCRIPTION OF THE DRAWINGS

A description of the present invention is made with reference to specific embodiments thereof as illustrated in the appended drawings. The drawings depict only typical embodiments of the invention and therefore are not to be considered limiting of its scope.

DETAILED DESCRIPTION OF THE INVENTION

Embodiments of the present invention for treatment of PPDC-impacted solids are now described with reference to the appended drawings. The invention can be practiced as any one of or combination of hardware and software, including but not limited to a system (including a computer processor for controlling the treatment method), a method (including a computer implemented method), an apparatus, an arrangement, a computer readable medium, a computer program product for controlling the treatment method, a graphical user interface, a web portal, or a data structure tangibly fixed in a computer readable memory. An article of manufacture for use with a computer processor for controlling the treatment method, such as a CD, pre-recorded disk or computer program storage medium having program code residing therein, also falls within the spirit and scope of the present invention. The appended drawings illustrate only typical embodiments of the present invention and therefore are not to be considered limiting of its scope and breadth.

In accordance with the present invention, an ex-situ soil treatment or processing method is disclosed for the transformation and/or removal of PPDC from solids by using high energy electron beams at relatively low temperature, preferably ambient to approximately 250 degrees C. Preferred energy, energy rate, and total dosage are preferably in the ranges of 3 to 10 MeV, 15-150 kGy/s, and up to 20 MGy, respectively.

The present invention has the following non-limiting advantages in comparison to conventional prior art methods: (1) high efficiency for transformation of PPDC by using electron beam irradiation; (2) high throughput unit for e-beam irradiation of solids to minimize costs and maximize efficiency; (3) separation and environmentally sound recycling, treatment, and/or disposal of liquid and gaseous organic compounds that are mobilized or created during the proposed treatment; and (4) use of low temperature (<250° C.) for minimizing costs and complexity of operation.

Figure 1:
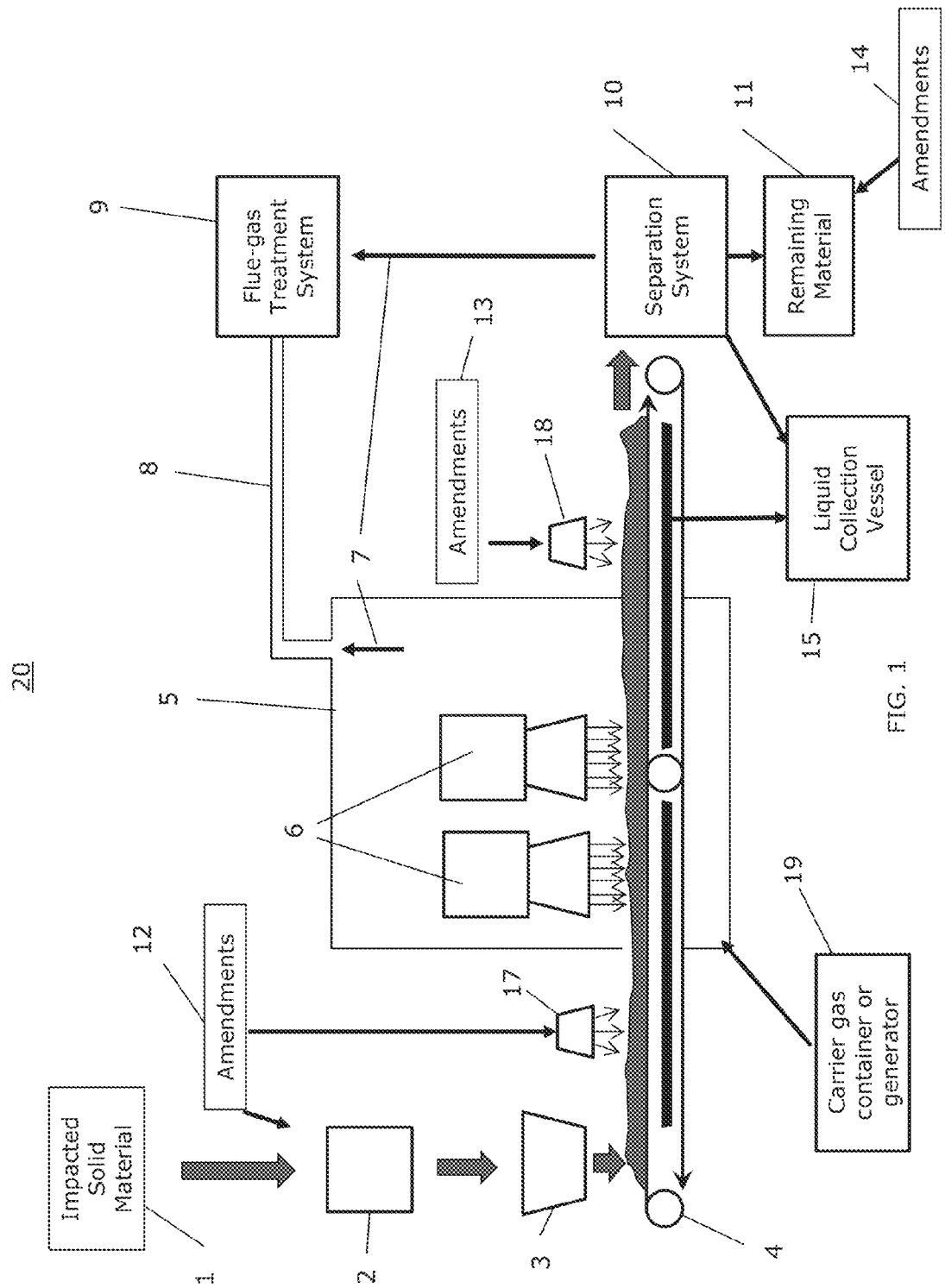
FIG. 1 is an exemplary block diagram of a system for treatment of solids in accordance with the present invention.

FIG. 1 shows block diagram of a system 20 for treatment of solids in accordance with the present invention. The treatment system of FIG. 1 for example, can be used to transform petroleum compounds and separate them from impacted solids 1. The system 20 includes a soil mixing system 2, a hopper or soil delivery system 3, a soil transport system or mechanism 4, such as a conveyor belt or other delivery system, in cooperation with a treatment chamber or vessel 5. Preferably, the transport system 4 is a permeable and/or shaker conveyor or other conveyor that transports, agitates and/or mixes impacted solid 1 and allows drainage of liquids from the solid matrix.

The treatment chamber 5 includes one or multiple irradiation source(s), for example an electron radiation or e-beam source or sources 6, for electron irradiating the impacted solid 1 disposed on the transport system 4. With multiple e-beam sources, the irradiation may be performed sequentially or simultaneously (in parallel), and with e-beams having the same or different characteristics, e.g., energy levels, rates, total dosage, etc. Different beam characteristics may be used to achieve different treatment objectives by applying electron beams with different characteristics such as in a desired sequence. By way of example, a first high energy beam may be applied to provide rapid removal of water followed by application of lower energy beam(s) to induce polymerization, hydrocarbon cracking, or other transformation(s).

The electron irradiation process in the treatment chamber 5 is optimized to accomplish the desired level of polymerization, separation, or any other preferred change in physical/chemical composition. Optimization can occur through adjustments of dosage, dosage rate, energy level, and temperature. Although irradiating a PPDC-impacted soil with an electron beam may result in isolated cracking of certain hydrocarbon compounds in the soil, the concentration of such hydrocarbons in a soil matrix is typically far too low to produce a self-sustaining cracking reaction, such as might result from irradiating a liquid petroleum feedstock. In contrast, the present invention is directed to treatment of PPDC-impacted solids that contain less than 70% (by wt.) PPDC, as determined by Total Petroleum Hydrocarbons (TPH) SW-846 Method 8015B (Revision 2, December 1996).

Off-gases 7 that may form at various stages of the soil treatment process (including within chamber 5 or separator 10 may be routed for example via a conduit 8 to a flue-gas treatment system 9 before being disposed. Separated off-gases 7 can be combusted or recycled.

Gas flow device 19 is in fluid communication with the chamber for delivering, driving or pulling a gas driver through the chamber for separating gases from liquids and irradiated PPDC-impacted solid material. The gas flow device may include a gas storage container, gas generator, pump, fan and/or vacuum. More specifically, gas flow device may include a pump connected to the flue-gas treatment system for propelling off-gases or combustion exhaust gases through the chamber.

In accordance with one embodiment, the irradiated solids are subject to heating at a temperature less than 250° C. prior to, during, or after e-beam treatment.

Selected agents or amendments 12 and 13 can be added prior to, during, or after e-beam treatment as shown via applicators 17, and/or 18 or other application devices to enhance the effectiveness of the e-beam irradiation and/or separation efficiency. Amendments 12 and 13 may include one or more of, but are not limited to, solvents (e.g., water, ethanol, or citrus oil), surfactants (e.g., lecithin), caustics (e.g. carbonates, hydroxides, or Alkaline Surfactant Polymer (ASP)), and polymers, such as polymers for extracting hydrocarbons from substrates (e.g., GreenStract®).

System 20 optionally includes a separation system 10 for (further) separating gases and liquids from the irradiated solids.

Remaining materials 11 may require amendment with soil enhancement additives 14, such as organic matter, bacterial starter, nutrients, buffers, before it can be used as on-site fill or beneficial reuse.

In another embodiment of the present invention, the transport system 4 and/or treatment chamber 5 may be in operatively coupled with a liquid collection vessel 15 to capture any drainage from the impacted solids as it is transported.

Figure 2:
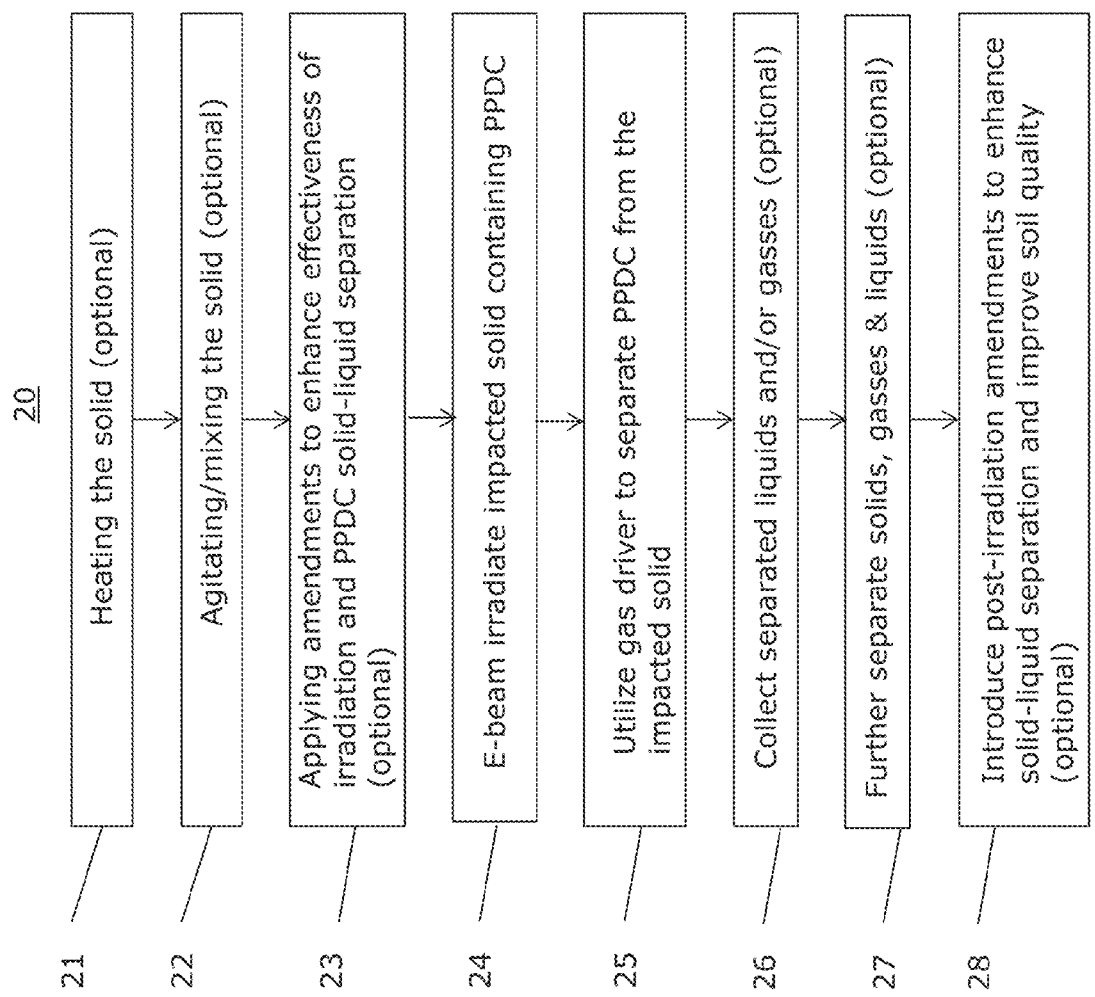
FIG. 2 is an exemplary flow diagram of a method for soil treatment in accordance with the present invention.

FIG. 2 shows a flow diagram of an exemplary process 30 in accordance with another aspect of the present invention. The process 30 can be implemented to treat PPDC-impacted solids and/or reduce TPH from solid materials. As shown in FIG. 2, a preferred method for treating PPDC-containing or impacted solids includes the steps of irradiating the impacted solids with one or more electron beams, step 24, and utilizing a gas driver to separate PPDC liquids and gases, step 25. Step 24 is optimized to achieve a treatment target, for example less than 1% TPH in the treated solid while minimizing energy demand, by adjusting irradiation energy level and energy rate. Optionally, the method 20 may include the steps of heating the impacted solids to a temperature no greater than 250 degrees C., step 21, mixing the solid, step 22, and applying amendments to enhance effectiveness of irradiation and solid-liquid separation, step 23. Steps 21-23 can be performed pre-irradiation, during irradiation, or post irradiation.

The present invention represents a significant improvement with respect to the state of the art because large amounts of PPDC containing materials can be treated rapidly and with high efficiency by using energy (3-10 MeV) and energy rate (15-150 kGy/s) electron irradiation and total dosage of up to 20 MGy at temperatures lower than 250° C. Traditional soil remediation and waste management approaches such as landfilling, biotreatment (composting, land farming, biopiles, etc.), combustion, or ex-situ thermal desorption (soil kiln) cannot perform at this level.

In addition to the embodiments of the present invention described above, further embodiments of the invention may be devised without departing from the basic scope thereof. For example, it is to be understood that the present invention contemplates that one or more elements of any embodiment can be combined with one or more elements of another embodiment. It is therefore intended that the embodiments described above be considered illustrative and not limiting, and that the appended claims be interpreted to include all embodiments, applications and modifications as fall within the true spirit and scope of the invention.

It is claimed:

1. A method for ex situ transformation of petroleum or petroleum derived compounds (PPDC) in PPDC-impacted solid material, comprising:
    irradiating the PPDC-impacted solid material with at least one electron beam source; and
    utilizing a gas driver to separate the PPDC from the PPDC-impacted solid material;
    wherein the hydrocarbon content of the PPDC-impacted solid materials is less than about 70% by weight PPDC.

2. The method according to claim 1, wherein the irradiating step includes the step of irradiating the PPDC-impacted solid material with multiple electron beam sources.

3. The method according to claim 2, wherein the step of irradiating with multiple electron beam sources comprises using electron beams with different characteristics.

4. The method according to claim 1, wherein the gas driver comprises one or more of air, nitrogen, argon, carbon dioxide, methane, natural gas and mixtures thereof.

5. The method according to claim 1, further comprising the step of treating off-gases with one or more of gas absorbents or an afterburner.

6. The method according to claim 1, further comprising the step of mixing or agitating the PPDC-impacted solid material prior to and/or during the irradiation of the solid material.

7. The method according to claim 1, further comprising the step of applying one or more amendments to the PPDC-impacted solid material, wherein the amendment comprises one or more of solvents, surfactants, caustics, polymers or mixtures thereof.

8. The method according to claim 1, further comprising the step of collecting liquids, solids or gases from the irradiated solid material.

9. The method according to claim 1, further comprising the step of separating liquid and gas from the irradiated solid material and adding a soil enhancement additive to the solid material, the soil enhancement additive comprising one or more of organic matter, bacterial starters, nutrients, buffers, or mixtures thereof.

10. The method according to claim 1, further comprising the step of heating the PPDC-impacted solid material to temperatures up to 250° C.

* * * * *